(12) United States Patent
Jeddeloh

(10) Patent No.: US 6,853,938 B2
(45) Date of Patent: Feb. 8, 2005

(54) CALIBRATION OF MEMORY CIRCUITS

(75) Inventor: Joseph Jeddeloh, Boulevard, MN (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 10/123,990

(22) Filed: Apr. 15, 2002

(65) Prior Publication Data

US 2003/0195714 A1 Oct. 16, 2003

(51) Int. Cl.$^7$ .................. G01R 35/00; H03K 19/00; G06F 12/00
(52) U.S. Cl. .................. 702/107; 702/79; 326/16; 711/170
(58) Field of Search .................. 702/69, 79, 85, 702/107; 326/16; 711/167, 170

(56) References Cited

U.S. PATENT DOCUMENTS

| | | |
|---|---|---|
| 5,751,642 A | 5/1998 | Yoo |
| 5,864,506 A | 1/1999 | Arcoleo et al. |
| 6,131,073 A * | 10/2000 | Honda et al. ............... 702/107 |
| 6,163,486 A | 12/2000 | Miura |
| 6,188,640 B1 | 2/2001 | Aikawa et al. |
| 6,434,081 B1 | 8/2002 | Johnson et al. |
| 6,462,591 B2 | 10/2002 | Garrett, Jr. et al. |
| 6,484,232 B2 | 11/2002 | Olarig et al. |
| 6,549,474 B2 | 4/2003 | Liu |
| 6,570,406 B2 * | 5/2003 | Tang et al. ................ 326/86 |
| 6,587,804 B1 * | 7/2003 | Johnson et al. ............ 702/107 |

* cited by examiner

Primary Examiner—John Barlow
Assistant Examiner—Meagan S Walling
(74) Attorney, Agent, or Firm—Fish & Neave LLP; Garry J. Tuma

(57) ABSTRACT

A method for calibration of memory circuits is provided that adjusts memory circuit output parameters based on data eye measurements. Data eye patterns from the memory circuit outputs are measured by the memory controller for different settings of the memory circuit output parameters. Memory circuit output parameters can be adjusted to settings that correspond to widest average data eye widths, highest average data eye heights, or other suitable criteria.

16 Claims, 4 Drawing Sheets

CALIBRATION OF MEMORY CIRCUITS

BACKGROUND OF THE INVENTION

This invention relates to the calibration of memory circuits in a computer system. More particularly, this invention relates to the calibration of memory circuits to reduce spurious data during memory circuit accesses.

Computer systems that incorporate memory circuits are generally designed to ensure high accuracy of the memory circuits because faulty memory circuits lead to malfunctioning computer systems. A common obstacle to proper functioning of memory circuits is lengthy transitional delay between ones and zeroes, as well as clock skew in the case of clocked memories. Spurious data occurs when ones are read as zeroes, and vice-versa.

Memory circuits increasingly incorporate variable drive buffers to drive data onto external busses. These buffers may be programmed to drive different levels of current and voltage in order to, for example, accommodate varying environmental conditions such as bus loading and ambient temperature. The adjustability of memory circuit output parameters can be used to reduce the probability of spurious data. One metric of memory circuit data quality is based on the measured data eye pattern of the memory circuit. Thus, it may be desirable to calibrate memory circuit output parameters based on measurements of the observed data eye patterns of memory circuit outputs.

SUMMARY OF THE INVENTION

It is an object of this invention to provide a method to calibrate memory circuit output parameters based on measurements of the observed data eye patterns of memory circuit outputs. Memory circuits that include outputs with adjustable parameters (e.g., output voltage levels, output current levels, and signal strength levels) are coupled to a memory controller that can write and read data into the memory circuits. Data is written into memory circuits by the memory controller, which then reads back the same data. When the data is read back, the dimensions of the resultant data eye pattern are measured by the memory controller with circuits such as capture registers.

The memory controller measures the data eye pattern of the memory circuit outputs with the parameters of the memory circuit adjusted to different settings. Various approaches are then taken to selecting appropriate settings for these parameters based on the observed data eye patterns. For example, a memory circuit output parameter may be adjusted to the setting that corresponds to the widest measured data eye pattern.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention provides a method for calibrating memory circuits that include adjustable output parameters. Examples of typical memory circuit output parameters include output voltage levels, output current level, and signal strength levels. By measuring the data eye width patterns at each setting of memory circuit output parameters, and selecting settings for these parameters that correspond to desirable data eye width patterns, the incidence of spurious data output from memory circuits can be reduced.

Calibration may be performed when memory circuits are first initialized and before they are put into operation. For example, in typical PC (Personal Computer) applications, calibration of memory circuits may take place when the computer system initializes. For PC applications, initialization routines are generally stored in its BIOS (Basic Input/Output System). The BIOS can be stored in a boot ROM (Read Only Memory) such as flash memory, which is not part of the memory circuits that are to be tested. Self-test and calibration routines are often performed on dynamic memory circuits such as DRAMs (Dynamic Random Access Memories) during execution of the BIOS so that memory circuits can be programmed to operate with their optimal operating parameters before they are used.

The quality of synchronous digital signals output by memory circuits can be monitored by observing the "data eye" patterns formed by the digital signals. When the outputs of any digital synchronous circuit transition between ones and zeroes and these transitions are captured on an oscilloscope, each trace can be overlapped over a previous trace. The resulting overlapping traces resemble a series of eyes, hence "data eye" patterns.

Figure 1:
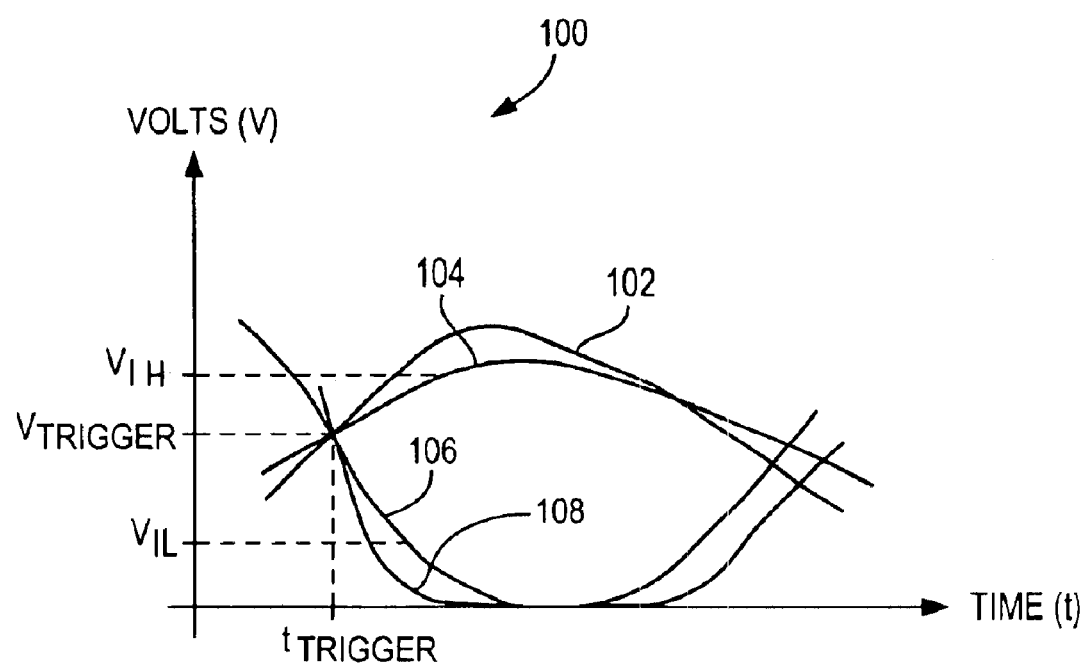
FIG. 1 is a diagram of a typical data eye observed on an oscilloscope.

An illustrative data eye pattern is shown in FIG. 1. Diagram 100 shows an oscilloscope diagram with four waveforms 102, 104, 106, and 108. The oscilloscope can be set to observe the voltage of an input signal to the Oscilloscope and to "trigger", i.e., to start capturing the waveform of the input signal on the oscilloscope once the input signal is at a specific voltage, $V_{TRIGGER}$. The input signal is displayed as a waveform on the oscilloscope such that the point at which the input signal crosses the voltage $V_{TRIGGER}$ is aligned with a specific time, $t_{TRIGGER}$, on the time axis of the oscilloscope. As shown in diagram 100, waveforms 102, 104, 106, and 108 are aligned with $t_{TRIGGER}$ on the time axis when each waveform crosses the $V_{TRIGGER}$ voltage level.

As shown in FIG. 1, a data eye pattern is formed by the contours of waveforms 102, 104, 106, and 108. The size of the perceived data eye depends on the selection of waveforms that form the contours of the data eye. For example, a first data eye can be perceived by selecting waveforms 104 and 106 to be its contours. A second data eye can be perceived by selecting waveforms 102 and 108 to be its contours. The first data eye is narrower in width than the second data eye.

When a digital circuit outputs a logical one signal, the signal is conventionally perceived to be a logical one if it is above a first threshold voltage ($V_{IH}$). When a digital circuit outputs a logical zero signal, the signal is conventionally perceived to be a logical zero if it is below a second threshold voltage ($V_{IL}$). One metric of synchronous digital signal quality is based on the amount of time required for a synchronous digital signal to reach these threshold levels and the amount of time that the signal stays above (or below) these threshold levels when the signal is meant to be at that level for a clock cycle. This metric is represented by the width of the data eye formed by the signal under observation.

Another metric of signal quality is based on the margin by which a digital circuit output exceeds threshold voltage $V_{IH}$ when outputting a logical zero signal. This metric may also include an observation of the margin by which a digital circuit output remains below threshold voltage $V_{IL}$. This metric of synchronous digital signal quality is represented by the height of the data eye formed by the signal under observation.

As illustrated in FIG. 1, waveform 102 reaches $V_{IH}$ before waveform 104 and waveform 108 reaches $V_{IL}$ before waveform 106. Moreover, waveform 102 and waveform 108 stay above and below the $V_{IH}$ and $V_{IL}$ levels respectively for a longer period of time than waveforms 104 and 106. Therefore, waveforms 102 and 108 are of better quality than waveforms 104 and 106. Coincidentally, the eye formed by waveforms 102 and 108 is wider than that formed by waveforms 104 and 106. Therefore, the quality of a digital signal can be measured through observation of the data eyes formed by the waveforms of the digital signal.

Memory circuits with adjustable output parameters are calibrated in accordance with the invention by adjusting the parameters based on the widths of the observed data eye patterns formed by the output signals of the memory circuit. For example, the width and height of the data eye are measured for different signal strength settings of the memory circuit outputs under calibration, and the memory circuit is then set to the signal strength setting corresponding to the largest data eye observed. Alternatively, the memory circuit outputs are observed over a period of time for each signal strength setting, and the average data eye width and height are then computed. The memory circuit is then set to the signal strength setting corresponding to the widest average data eye width or highest average data eye height. For clarity, calibration of memory circuits based on observed data eye patterns according to the invention is described in the following discussion primarily in the context of observing data eye widths instead of data eye heights. One skilled in the art will appreciate that the present invention includes calibration of memory circuits based on observed data eye heights and data eye widths.

If the signal strength of each memory circuit output can be individually adjusted, the signal strength setting may be selected that corresponds to the widest data eye or widest average data eye measured for each memory circuit output. Otherwise, data eye width measurements may be taken for all memory circuit outputs or any suitable subset thereof, and the average of the data eye widths over all measured circuit outputs are then computed for each signal strength setting. The signal strength setting corresponding to the widest of the average data eye widths over all measured circuit outputs may then be selected.

Data vectors can be stored in the boot ROM and accessed by the memory controller, which then writes and reads back the data vectors to and from the memory circuits at different signal strength settings. Alternatively, data vectors can be pre-stored in the memory circuits, and can be read back by the memory controller. In yet another approach, the memory controller may generate the data vectors that are to be written to the memory circuits. The memory circuit then observes the data eye at each signal strength setting. Depending on the nature of the memory circuit under calibration, the signal strength may be a function of a specific programmable setting or a function of any combination of memory circuit output voltage or current level settings. If the signal strength is directly programmable through a specific programmable setting, the memory controller can measure the width of the data eye at different settings for signal strength. If the signal strength is a function of output voltage or current level settings, the memory controller can observe the data eye for different settings of output voltage or current level or any combination thereof. Calibration may be performed by hardware or software that writes and reads back data vectors to and from the memory circuits for different settings of various memory circuit parameters.

Figure 2:
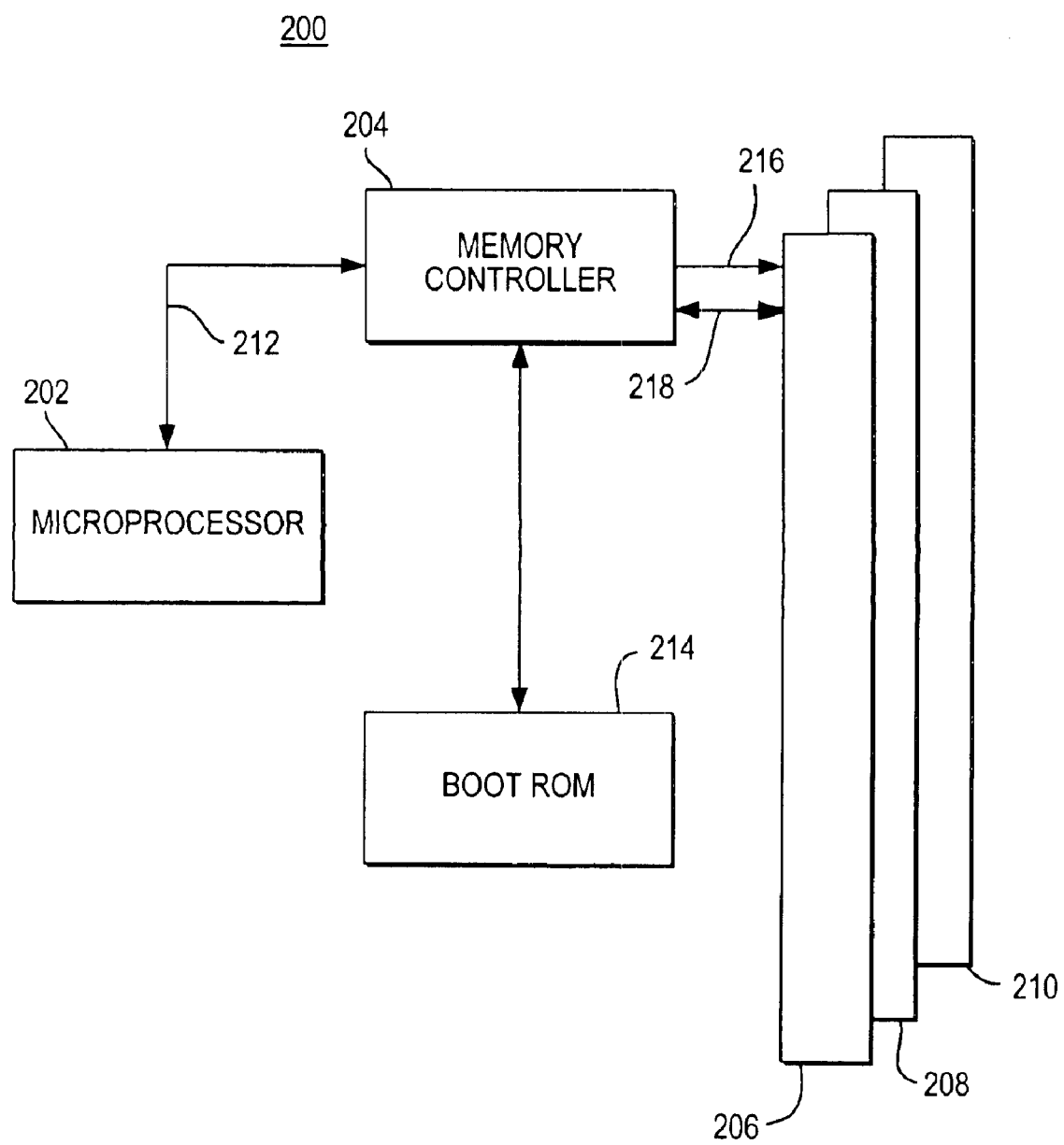
FIG. 2 is a block diagram of a typical computer system.
Figure 3:
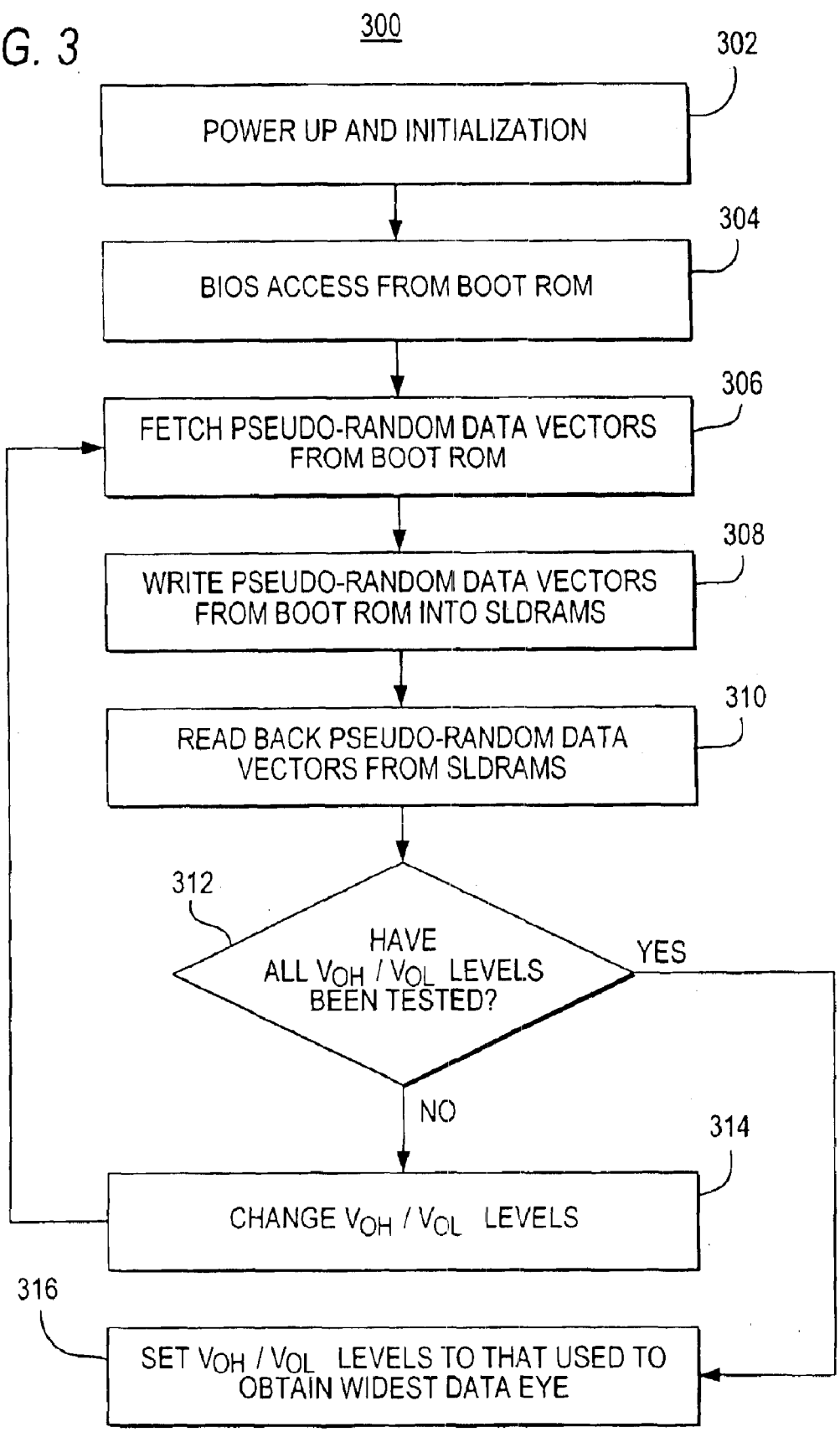
FIG. 3 is a flow chart of a preferred embodiment of a computer system initialization process according to the present invention.
Figure 4:
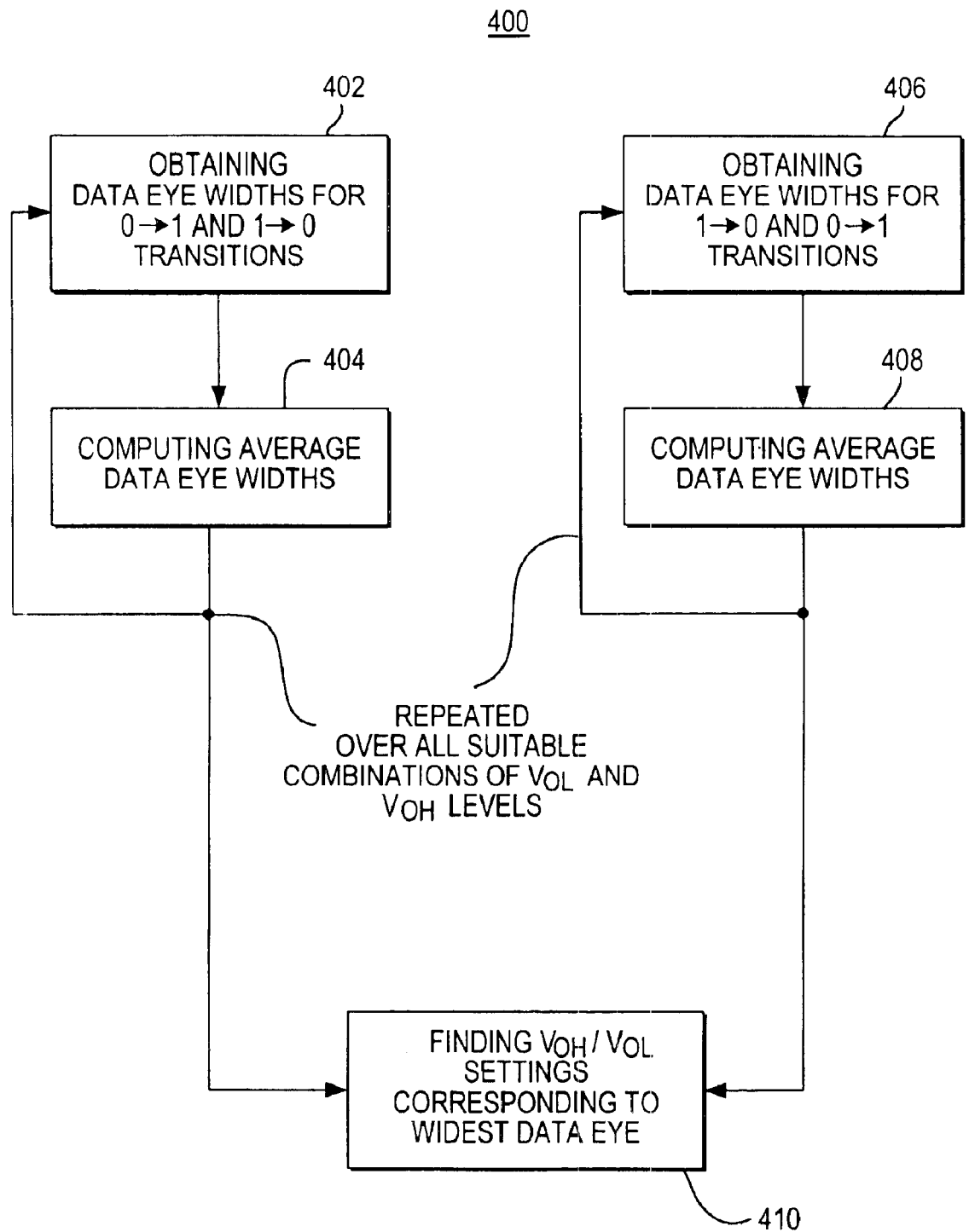
FIG. 4 is a flow chart of a preferred embodiment of process for selection of $V_{OH}/V_{OL}$ levels in accordance with the present invention.

FIGS. 2–4 relate to calibration of a particular type of memory circuits with configurable memory circuit parameters such as $V_{OH}$ (Voltage Output High) levels and $V_{OL}$ (Voltage Output Low) levels. One type of memory circuit with configurable memory circuit parameters that can be calibrated according to the present invention is DDRII SDRAM (Double Data Rate Synchronous Dynamic Random Access Memory). For convenience, adjustment of memory circuit output parameters will be discussed in connection with adjustment of $V_{OH}$ and $V_{OL}$ levels. Adjustment of other memory circuit parameters (e.g., signal strength settings, output current settings, and data timing settings) can be performed based on data eye width measurements in accordance with the present invention.

During initialization of the memory controller, the memory controller can fetch data vectors, for example, pseudo-random data vectors, from the boot ROM, and write data based on these vectors into the memory circuits. The data is then read back from the memory circuits while the memory controller monitors the width of the resulting data eye patterns. In one approach, the memory controller first steps through all possible $V_{OH}$ levels while keeping the $V_{OL}$ level fixed and monitoring the width of the resulting data eye pattern for each $V_{OH}$ level. The memory controller can store the widest data eye width for a particular $V_{OH}$ level and $V_{OL}$ level, or compute and store the average data eye width for a particular $V_{OH}$ level and $V_{OL}$ level. The memory controller then changes the $V_{OL}$ level and steps through all possible $V_{OH}$ levels while keeping the $V_{OL}$ level fixed and monitoring the width of the resulting data eye pattern for each $V_{OH}$ level. The following table illustrates the tabulation of data eye widths obtained using this approach. For every combination of $V_{OH}$ and $V_{OL}$ levels tested by the memory controller, the memory controller stores either the widest data eye width or widest average data eye width associated with each combination. The memory controller can then set the $V_{OH}$ and $V_{OL}$ levels that correspond to the widest data eye width.

| | $V_{OH}$ | | | |
|---|---|---|---|---|
| $V_{OL}$ | $V_{OH1}$ | $V_{OH2}$ | $V_{OH3}$ | $V_{OH4}$ |
| $V_{OL1}$ | Eye width$_{11}$ | Eye width$_{21}$ | Eye width$_{31}$ | Eye width$_{41}$ |
| $V_{OL2}$ | Eye width$_{12}$ | Eye width$_{22}$ | Eye width$_{32}$ | Eye width$_{42}$ |
| $V_{OL3}$ | Eye width$_{13}$ | Eye width$_{23}$ | Eye width$_{33}$ | Eye width$_{43}$ |
| $V_{OL4}$ | Eye width$_{14}$ | Eye width$_{24}$ | Eye width$_{34}$ | Eye width$_{44}$ |

FIG. 2 shows a typical computer system 200. Microprocessor 202 is preferably coupled to memory controller 204 with system bus 212. In some computer systems, memory controller 204 is part of microprocessor 202. Memory controller 204 is preferably coupled to boot ROM 214 as well as memory circuits 206, 208, and 210. BIOS instructions and data can be stored on boot ROM 214 and can be accessed by microprocessor 202 through memory controller 204 for initialization purposes. Memory circuits 206, 208, and 210 are preferably coupled to memory controller 204 with unidirectional command bus 216 and bidirectional data bus 218.

FIG. 3 shows illustrative process 300 that may be used to measure the data eye at different $V_{OH}$ and $V_{OL}$ levels. At step 302, microprocessor 202 powers up and initializes. At step 304, BIOS instructions can be accessed from boot ROM 214 by memory controller 204. At step 306, pseudo-random data vectors can be read from boot ROM 214. These data vectors can be written into memory circuits 206, 208, and 210 by memory controller 204 at step 308. At step 310, the same data vectors are read back from memory circuits 206, 208, and 210, and the data eye widths are obtained by memory controller 204 based on values of data vectors that are read back. During a first pass through this process, memory controller 204 can be initialized with default settings for $V_{OH}$ and $V_{OL}$ levels.

At step 310, the data eye width measurements are made at a specific $V_{OH}$ and $V_{OL}$ levels. At step 314, memory controller 204 can change the $V_{OH}$ or $V_{OL}$ level or both levels. The settings can be changed automatically by memory controller 204. Alternatively, the settings can be changed based on data read from the boot ROM or any other suitable source by memory controller 204.

Process 300 can be repeated from step 30 with different settings for $V_{OH}$ and $V_{OL}$ levels. When it is determined that data eye width measurements have been obtained for all suitable combinations of $V_{OH}$ or $V_{OL}$ levels at step 312, the $V_{OH}$ and $V_{OL}$ levels can be set to the settings that correspond to the widest data eye or widest average eye pattern at step 316. By setting $V_{OH}$ and $V_{OL}$ levels to those that correspond to the widest data eye pattern (or widest average eye pattern), the probability that the memory circuit thus calibrated will provide spurious data under operating conditions may be reduced.

In one embodiment, the width of the data eye can be measured by providing a clock signal to the memory circuit for read accesses ("read clock") and observing the data that is read from the memory circuit with an observation circuit that is clocked by a phase-adjustable clock signal. The phase-adjustable clock is phase adjusted in small increments. It has a range of adjustment greater than or equal to the read data clock width. It is then capable of sweeping the entire read data eye. The phase-adjustable clock can be initially set to be in phase with the read clock. The memory controller then initiates read accesses from the memory circuit under calibration. The observation circuit records a "pass" when the data read from a particular memory circuit location matches the data written to that location. The observation circuit records a "failure" when the data read from a particular memory location does not match the data written to that location. The phase difference between the phase-adjustable clock and the read clock can be incrementally increased, while the memory controller continues to initiate read accesses from the memory circuit under calibration. At each increment of the phase difference, the observation circuit records the numbers of passes and failures. As the phase difference between the two clocks increases, the observation circuit will eventually observe a failure. As the phase difference between the two clocks approaches 360 degrees, the observation circuit will start to record passes again. In this embodiment, the data eye width is equal to the length of time (in phase difference increments) that the observation circuit records passes.

Data eye width measurements relevant to the invention can be taken when outputs of the memory circuit switch from: (i) a logic-0 to a logic-1 and from a logic-1 to a logic-0 or (ii) a logic-1 to a logic-0 and from a logic-0 to a logic-1 during a single clock period. For the first type of transition, only the "top" half of the data eye is measured. For the second type of transition, only the "bottom" half of the data eye is measured. Alternatively, both the "top" and "bottom" of the data eye can be measured, and the average of the two types of measurements may be used to calibrate memory circuits in accordance with the invention. This last approach to measuring data eye widths is illustrated in FIG. 4.

FIG. 4 shows illustrative process 400 for measuring and computing average data eye widths. At step 402, memory controller 204 first obtains data eye widths based on logic-1 to logic-0 followed by logic-0 to logic-1 transitions (within a clock period). These widths can be averaged to obtain an average data eye width for this pattern of transitions at step 404. Memory controller 204 can obtain data eye widths for logic-0 to logic-1 followed by logic-1 to logic-0 transitions (within a clock period) at step 406. These widths can also be averaged to obtain an average data eye width for this pattern of transitions at step 408. Steps 402 to 404 and steps 406 to 408 can be repeated for all suitable combinations of $V_{OH}$ and $V_{OL}$ levels and can be performed in parallel or sequentially. When average data eye widths for all suitable combinations of $V_{OH}$ and $V_{OL}$ levels are known, memory controller 204 can find the particular combination of $V_{OH}$ and $V_{OL}$ levels that Corresponds to the widest average data eye width at step 410.

Alternatively, $V_{OH}$ and $V_{OL}$ levels may be adjusted based on the narrowest data eye width observed as opposed to average data eye width. It may be desirable to find the poorest quality data eye (i.e., narrowest data eye width) observed for each combination of $V_{OH}$ and $V_{OL}$ levels because the narrowest data eye width may represent worst case timing for each combination of $V_{OH}$ and $V_{OL}$ levels. The memory circuit can thus be calibrated with the combination of $V_{OH}$ and $V_{OL}$ levels that corresponds to the widest of the narrowest data eye widths observed for each combination of $V_{OH}$ and $V_{OL}$ levels.

Thus it is seen that memory circuits can be calibrated based on measuring data eye patterns. One skilled in the art will appreciate that the present invention can be practiced by other than the described embodiments, which are presented for purposes of illustration and not of limitation, and the present invention is limited only by the claims which follow.

What is claimed is:

1. A method for calibrating memory circuits based on data eye dimensions, wherein said memory circuits have at least one output that has at least one adjustable parameter, said method comprising:

writing data into said memory circuits;

adjusting a subset of said parameters of said outputs of said memory circuits to a plurality of settings;

measuring data eye dimensions of said output at each of said plurality of settings over a given period of time;

computing average data eye dimensions based on measured data eye dimensions for each of said plurality of settings, wherein said average data eye dimensions comprise average data eye widths;

selecting settings for said subset of parameters among said plurality of settings that correspond to a widest one of said average data eye widths; and adjusting said subset of parameters of said outputs to said settings corresponding to said widest one of said average data eye widths.

2. The method of claim 1 wherein said data comprise pseudo-random data vectors.

3. The method of claim 1 wherein said memory circuits comprise Double Data Rate II Synchronous Dynamic Random Access Memories.

4. The method of claim 1 wherein said outputs of said memory circuits comprise data outputs of said memory circuits.

5. A method of calibrating memory circuits based on data eye dimensions, wherein said memory circuits have at least one output that has at least one adjustable parameter, said method comprising:
- writing data into said memory circuits;
- adjusting a subset of said parameters of said outputs of said memory circuits to a plurality of settings;
- measuring data eye dimensions of said output at each of said plurality of settings over a given period of time;
- computing average data eye dimensions based on measured data eye dimensions for each of said plurality of settings, wherein said average data eye dimensions comprise average data eye heights;
- selecting settings for said subset of parameters among said plurality of settings that correspond to a highest one of said average data eye heights; and
- adjusting said subset of said parameters of said outputs to said settings corresponding to said highest one of said average data eye heights.

6. A method of calibrating memory circuits based on data eye dimensions, wherein said memory circuits have at least one output that has at least one adjustable parameter, said method comprising:
- writing data into said memory circuits;
- adjusting a subset of said parameter of said outputs of said memory circuits to a plurality of settings;
- measuring data eye dimensions, wherein data eye dimensions comprise data eye widths, at each of said plurality of settings over a given period of time;
- selecting a smallest data eye width among measured data eye widths for each of said plurality of settings;
- selecting settings for said subset of parameters among said plurality of settings that correspond to a widest one of said smallest data eye widths; and
- adjusting said subset of said parameters of said outputs to said settings corresponding to said widest one of said smallest data eye widths.

7. A method of calibrating memory circuits based on data eye dimensions, wherein said memory circuits have at least one output that has at least one adjustable parameter, said method comprising:
- writing data into said memory circuits;
- adjusting a subset of said parameter of said outputs of said memory circuits to a plurality of settings;
- measuring data eye dimensions, wherein data eye dimensions comprise data eye heights, at each of said plurality of settings over a given period of time;
- selecting a smallest data eye height among measured data eye heights for each of said plurality of settings;
- selecting settings for said subset of parameters among said plurality of settings that correspond to a largest one of said smallest data eye heights; and
- adjusting said subset of said parameters of said outputs to said settings corresponding to said largest one of said smallest data eye heights.

8. A method of calibrating memory circuits based on data eye dimensions, wherein said memory circuits have at least one output that has at least one adjustable parameter, said method comprising:
- writing data into said memory circuits;
- adjusting a subset of said parameter of said outputs of said memory circuits to a plurality of settings, said adjusting comprising:
  - (a) keeping settings of all but one of said subset of said parameters constant;
  - (b) adjusting said one of said subset of said parameters to a plurality of settings; and
  - (c) repeating (a) and (b) for each one of said subset of said parameters;
- measuring data eye dimensions of said output at each of said plurality of settings; and
- adjusting settings of said subset of said parameters of said outputs based on said measured data eye dimensions.

9. A circuit for calibrating memory circuits based on data eye dimensions, wherein said memory circuits have at least one output that has at least one adjustable parameter, said circuit comprising:
- writing circuitry that writes data into said memory circuits;
- adjusting circuitry that adjusts a subset of said parameters of said outputs of said memory circuits to a plurality of settings;
- measurement circuitry that measures data eye widths at each of said plurality of settings over a given period of time;
- computing circuitry that computes average data eye dimensions based on measured data eye dimensions, wherein said average data eye dimensions comprise average data eye widths, for each of said plurality of settings;
- selection circuitry that selects settings for said subset of parameters among said plurality of settings that correspond to a widest one of said average data eye widths; and
- measurement circuitry that measures said subset of said parameters of said outputs to said settings corresponding to a widest one of said average data eye widths;
- wherein said adjusting circuitry adjusts said subset of said parameters of said outputs based on said measured data eye widths.

10. The circuit of claim 9 wherein said data comprise pseudo-random data vectors.

11. The circuit of claim 10 wherein said memory circuits comprise Double Data Rate II Synchronous Dynamic Random Access Memories.

12. The circuit of claim 10 wherein said outputs of said memory circuits comprise data outputs of said memory circuits.

13. A circuit for calibrating memory circuits based on data eye dimensions, wherein said memory circuits have at least one output that has at least one adjustable parameter, said circuit comprising:
- writing circuitry that writes data into said memory circuits;
- adjusting circuitry that adjusts a subset of said parameters of said outputs of said memory circuits to a plurality of settings;
- measurement circuitry that measures data eye heights at each of said plurality of settings over a given period of time;
- computing circuitry that computes average data eye dimensions based on measured data eye dimensions, wherein said average data eye dimensions comprise average data eye heights, for each of said plurality of settings;
- selection circuitry that selects settings for said subset of parameters among said plurality of settings that correspond to a highest one of said average data eye heights; and measurement circuitry that measures said subset of said parameters of said outputs to said settings corresponding to a widest one of said average data eye heights;

wherein said adjusting circuitry adjusts said subset of said parameters of said outputs based on said measured data eye heights.

14. A circuit for calibrating memory circuits based on data eye dimensions, wherein said memory circuits have at least one output that has at least one adjustable parameter, said circuit comprising:

writing circuitry that writes data into said memory circuits;

adjusting circuitry that adjusts a subset of said parameters of said outputs of said memory circuits to a plurality of settings;

measurement circuitry that measures data eye dimensions, wherein said data eye dimensions comprise data eye widths, at each of said plurality of settings over a given period of time;

selection circuitry that selects a smallest data eye width among measured data eye widths for each of said plurality of settings;

selection circuitry that selects settings for said subset of parameters among said plurality of settings that correspond to a widest one of said smallest data eye widths; and adjusting circuitry that adjusts said subset of said parameters of said outputs to said settings corresponding to said widest one of said smallest data eye widths.

15. A circuit for calibrating memory circuits based on data eye dimensions, wherein said memory circuits have at least one output that has at least one adjustable parameter, said circuit comprising:

writing circuitry that writes data into said memory circuits;

adjusting circuitry that adjusts a subset of said parameters of said outputs of said memory circuits to a plurality of settings;

measurement circuitry that measures data eye dimensions, wherein said data eye dimensions comprise data eye heights, at each of said plurality of settings over a given period of time;

selection circuitry that selects a smallest data eye height among measured data eye heights for each of said plurality of settings;

selection circuitry that selects settings for said subset of parameters among said plurality of settings that correspond to a largest one of said smallest data eye heights; and adjusting circuitry that adjusts said subset of said parameters of said outputs to said settings corresponding to said largest one of said smallest data eye heights.

16. A circuit for calibrating memory circuits based on data eye dimensions, said memory circuits having at least one output that has at least one adjustable parameter, said circuit comprising:

writing circuitry that writes data into said memory circuits;

adjusting circuitry that adjusts a subset of said parameters of said outputs of said memory circuits to a plurality of settings, said adjusting circuitry comprising circuitry that (a) keeps settings of all but one of said subset of said parameters constant; (b) adjusts said one of said subset of said parameters to a plurality of settings; and (c) repeat (a) and (b) for each one of said subset of said parameters; and measurement circuitry that measures data eye dimensions of said outputs at each of said plurality of settings, wherein said adjusting circuitry adjusts said subset of said parameters of said outputs based on said measured data eye dimensions.

* * * * *

UNITED STATES PATENT AND TRADEMARK OFFICE
CERTIFICATE OF CORRECTION

PATENT NO. : 6,853,938 B2
DATED : February 8, 2005
INVENTOR(S) : Jeddeloh

It is certified that error appears in the above-identified patent and that said Letters Patent is hereby corrected as shown below:

Column 1,
Line 66, insert -- a -- before "process".

Column 2,
Line 36, change "Oscilloscope" to -- oscilloscope --.

Column 5,
Line 16, delete "a" before "specific".
Line 22, change "30" to -- 306 --.

Column 7,
Lines 46 and 65, "change "parameter" to -- parameters --.

Column 8,
Lines 40 and 43, change "10" to -- 9 --.

Signed and Sealed this

Ninth Day of August, 2005

JON W. DUDAS
*Director of the United States Patent and Trademark Office*